United States Patent
Feri et al.

(10) Patent No.: US 9,968,018 B2
(45) Date of Patent: May 8, 2018

(54) COMMISSIONING OF A BUILDING SERVICE SYSTEM

(75) Inventors: Lorenzo Feri, Eindhoven (NL); Ashish Vijay Pandharipande, Eindhoven (NL); Ying Wang, Eindhoven (NL); Tim Corneel Wilhelmus Schenk, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 820 days.

(21) Appl. No.: 13/701,709

(22) PCT Filed: Jun. 8, 2011

(86) PCT No.: PCT/IB2011/052497
§ 371 (c)(1),
(2), (4) Date: Feb. 7, 2013

(87) PCT Pub. No.: WO2011/154906
PCT Pub. Date: Dec. 15, 2011

(65) Prior Publication Data
US 2013/0145610 A1    Jun. 13, 2013

(30) Foreign Application Priority Data
Jun. 10, 2010   (EP) ..................................... 10165527

(51) Int. Cl.
*H01S 4/00* (2006.01)
*H05K 13/00* (2006.01)
(Continued)

(52) U.S. Cl.
CPC ................ *H05K 13/00* (2013.01); *G01S 5/00* (2013.01); *H04L 12/56* (2013.01); *H04N 7/18* (2013.01);
(Continued)

(58) Field of Classification Search
CPC ................ H05B 37/0227; H05K 13/00; Y10T 29/49002
(Continued)

(56) References Cited

U.S. PATENT DOCUMENTS 4,698,937 A * 10/1987 Kornbrekke ............ E05F 15/73
250/221
5,128,654 A    7/1992 Griffin et al.
(Continued)

FOREIGN PATENT DOCUMENTS

CN         1943280 A     4/2007
CN       101026745 A *   8/2007
(Continued)

*Primary Examiner* — Peter DungBa Vo
*Assistant Examiner* — Azm Parvez
(74) *Attorney, Agent, or Firm* — Akarsh P. Belagodu

(57) ABSTRACT

The invention relates to adjusting at least one of installed building service sensors (10) of a building service system. A sensor coverage area of at least one sensor (10) is adjusted based on information on a position of the installed sensor (10) relative to at least one other sensor (10). For example, to determine the position of the sensor (10) relative to said at least one other sensor (10), each sensor (10) establishes a wireless communication between said sensor (10) and at least one other sensor (10) via a wireless communication means (34) of the sensor (10). For example, information on the positions of the installed sensors (10) is used to assign to each sensor (10) at least one of installed building service supply devices (12) of the system.

13 Claims, 2 Drawing Sheets

(51) Int. Cl.
*H05B 37/02* (2006.01)
*G01S 5/00* (2006.01)
*H04L 12/54* (2013.01)
*H04N 7/18* (2006.01)

(52) U.S. Cl.
CPC .... *H05B 37/0227* (2013.01); *Y10T 29/49002* (2015.01)

(58) Field of Classification Search
USPC ............ 29/592.1; 340/539.1, 539.2, 539.22, 340/539.23; 700/276, 275, 90, 277
See application file for complete search history.

(56) References Cited

U.S. PATENT DOCUMENTS

| | | | |
|---|---|---|---|
| 5,956,159 A * | 9/1999 | Mutou | H04N 1/0402 250/208.1 |
| 6,222,191 B1 * | 4/2001 | Myron | G08B 13/193 250/340 |
| 7,045,968 B1 | 5/2006 | Bierman et al. | |
| 7,307,542 B1 | 12/2007 | Chandler et al. | |
| 7,411,489 B1 * | 8/2008 | Elwell | G08B 13/1645 307/116 |
| 2005/0057741 A1 * | 3/2005 | Anderson | G01S 7/4814 356/5.01 |
| 2007/0106518 A1 | 5/2007 | Wildman et al. | |
| 2007/0262259 A1 | 11/2007 | Wu et al. | |
| 2008/0143546 A1 | 6/2008 | Rantala | |
| 2008/0315772 A1 | 12/2008 | Knibbe | |
| 2009/0027574 A1 | 1/2009 | Edwards | |
| 2009/0066473 A1 * | 3/2009 | Simons | G01S 5/0027 340/3.1 |
| 2010/0033326 A1 | 2/2010 | Atkins et al. | |
| 2010/0231705 A1 * | 9/2010 | Yahav | G02B 27/01 348/115 |

FOREIGN PATENT DOCUMENTS

| | | |
|---|---|---|
| CN | 101472371 A | 7/2009 |
| JP | 62214411 A | 9/1987 |
| JP | 10162967 A | 6/1998 |
| JP | 10162969 A | 6/1998 |
| JP | 2008235120 A | 10/2008 |
| JP | 2008249206 A | 10/2008 |
| JP | 2011061904 A | 3/2011 |
| WO | 2006095315 A1 | 9/2006 |
| WO | 2006095317 A1 | 9/2006 |
| WO | 2006136985 A1 | 12/2006 |
| WO | 2007102097 A1 | 9/2007 |
| WO | 2008001267 A2 | 1/2008 |

* cited by examiner

COMMISSIONING OF A BUILDING SERVICE SYSTEM

FIELD OF THE INVENTION

The invention relates to the field of building service systems comprising building service sensors.

BACKGROUND OF THE INVENTION

The commissioning and configuration of a building service system, such as, for example, a lighting system with lighting elements or luminaires and with lighting control units, is a time consuming task requiring the services of, e.g., a lighting control specialist.

From WO 2006/95317 A1, there is known a method for commissioning installed building service devices comprising establishing wireless communication between plural building service devices to determine spatial positions of each device relative to at least three reference nodes by triangulation of the signal. A building services commissioning system generates a spatial position map of said devices based on the coordinates of the determined spatial positions. This map is compared to a building services plan to obtain configuration data for each device. Based on the configuration data, configuration commands that establish which lighting devices are responsive to which switching control devices are issued to each device to commission the system. The switching control devices are, for example, motion sensors or presence detectors, dimmer controllers, or thermostats.

SUMMARY OF THE INVENTION

It would be desirable to provide a building service system as well as a method of adjusting at least one sensor of a building service system that allow to improve the precision of sensor based control of building services.

It would also be desirable to provide such system and method, in which commissioning of the system is simplified.

To better address one or more of these concerns, in a first aspect of the invention, there is provided a method of adjusting at least one sensor of installed building service sensors of a building service system, the method comprising the step of: adjusting a sensor coverage area of said at least one sensor, the adjusting of the sensor coverage area of each of said at least one sensor being based on information on a position of the installed sensor relative to at least one other sensor of the installed building service sensors.

Said at least on other sensor may comprise at least one further sensor other than said at least one sensor the sensor coverage of which is to be adjusted.

In the following, said installed building service sensors will also be referred to as "first sensors".

In the description and the appended claims, the term "sensor coverage area" is to be understood as the area that is monitored by the sensor. In other words, it is the area that determines the sensor input. For example, the sensor coverage area may be determined by an aperture angle or opening angle of the installed sensor, in particular in case of a non-contact sensor that monitors an area in front of or around the sensor. For example, the sensor coverage area may be a two-dimensional area, such as a floor area, or a three-dimensional area such as a portion of an indoor space.

Adjusting the sensor coverage area dependent on information on a position of the installed sensor relative to at least one other of the installed sensors allows to control a spatial relation between the sensor coverage areas of a sensor and the respective at least one other sensor. For example, the sensor coverage areas may be adjusted to be mutually exclusive or, for example, the sensor coverage area of a sensor may be adjusted to overlap at maximum a predetermined proportion of a coverage area of an other sensor and/or at minimum a predetermined proportion of a coverage area of an other sensor. Thus, precision of sensor triggering may be improved. This may help to prevent situations where e.g. a person working at a workspace might trigger unnecessary illumination of a neighboring workspace. Allowing the areas to overlap may help to reduce uncovered space in which e.g. a person would not be recognized by presence detection sensors.

For example, the method may be a method of adjusting at least two sensors of installed building service sensors of a building service system, the method comprising the step of: adjusting a sensor coverage area of said at least two sensors, the adjusting of the sensor coverage area of each of said at least two sensors being based on information on a position of the installed sensor relative to at least one other sensor of the installed building service sensors. Said at least on other sensor may comprise at least one other sensor of said at least two sensors and/or may comprise at least one further sensor other than said at least two sensors.

For example, the method is a method of commissioning the building service system.

For example, the method may be a method of re-adjusting the at least one building service sensor.

For example, the method may be a method of operating a building service system, said method comprising the step of adjusting a sensor coverage area of said at least one sensor, the adjusting of the sensor coverage area of each of said at least one sensor being based on information on a position of the installed sensor relative to at least one other sensor of the installed building service sensors.

In the following, there will also be used the term "positional information" for said information on a position of the installed sensor. The positional information is, for example, a position or spatial position of the sensor relative to said at least one other sensor, in particular a spatial position in two or three dimensions. Further, for example, said positional information may be a distance between the sensor and a respective other of the sensors.

For example, said information on a position of the installed sensor relative to at least one other of the installed sensors is information on a position of the installed sensor relative to at least one neighboring, installed sensor. For example, said information may be information on a position of the installed sensor relative to neighboring installed sensors.

For example, said adjusting of a sensor coverage area of said at least one sensor may comprise each sensor of said at least one sensor performing the step of adjusting of a sensor coverage area of the sensor based on information on a position of the sensor relative to at least one other installed sensor of the installed sensors. Thus, each individual sensor may use positional information in order to adjust the sensor coverage area of the sensor. For example, the method may comprise a step of the system performing a self-adjusting of a sensor coverage area of said at least one installed sensor, said step comprising each sensor of said at least one sensor performing an adjusting of a sensor coverage area of the sensor based on information on a position of the installed sensor relative to at least one other installed sensor of the installed building service sensors. For example, said adjusting may be controlled by the respective sensor and/or by a control unit of the building service system.

For example, the step of adjusting a sensor coverage area of said at least one sensor may comprise adjusting a sensor coverage area of each sensor of said at least one sensor individually, based on information on a position of the installed sensor relative to at least one other installed sensor of the installed building service sensors.

For example, said spatial position may be in the form of a map of the spatial arrangement of at least said at least one installed sensor or, for example, of installed, neighboring sensors of a sensor. That is, in the step of adjusting a sensor coverage area of said at least one sensor, the sensor coverage area of each sensor of said at least one sensor may be adjusted based on a map of a spatial arrangement of installed sensors comprising said at least one sensor, or, for example, based on a map of the spatial arrangement of installed, neighboring sensors. The map comprises spatial information about the respective sensors.

For example, the building service sensors are installed in an indoor space or in a multi-occupant space. For example, said space may comprise workspace areas for people.

For example, the system further comprises at least one installed building service supply device, the method further comprising the step of: using information on the position of said at least one sensor to assign to each sensor of said at least one sensors at least one of the at least one installed building service supply device. Such assigning of installed building service supply devices to installed sensors is also known as "binding" the building service supply devices to the sensors. For example, information on the position of said at least one sensor and information on the position of the at least one installed building service supply device may be used for said assigning. For example, said information on the position of the at least one installed sensor may be information on a spatial positions of the installed building service sensor(s) relative to the installed building service supply device(s).

Thus, to each sensor, there may be assigned at least one of installed building service supply devices, which is/are to be controlled by the sensor, e.g. controlled based on an output signal of the sensor.

For example, information on the adjusted sensor coverage area of each of said at least one sensor may be used to assign to each of said at least one sensor at least one of the installed building service supply devices.

For example, information on the position of said at least one sensor may be used for said assigning, in that, in a first step, said information on the position of the installed sensor is used for adjusting the sensor coverage area of the installed sensor based on said information, and, in a second step, information on the adjusted sensor coverage area is used for said assigning.

For example, the at least one installed building service supply device comprises any one or more of luminaires, heating units, ventilation units and air-conditioning units. Such units may consist of one or more air inlets and/or outlets and/or valves.

For example, in the step of adjusting a sensor coverage area, the sensor coverage area of each sensor of said at least one sensor is adjusted based on information on a position of the installed sensor relative to at least a neighboring sensor, preferably a nearest neighboring sensor, of the building service sensors. For example, a neighboring sensor or a nearest neighboring sensor may be determined based on information on relative spatial positions of the installed sensors. For example, the method may comprise comparing distances between the installed sensors.

For example, the method may comprise determining said relative positional information. For example, the method may comprise determining, for each sensor of said at least one sensor, a spatial position of the sensor relative to at least one neighboring sensor of said sensor.

For example, each sensor of said at least one sensor comprises a sensor coverage adjusting unit for adjusting a sensor coverage area of the sensor, and in the step of adjusting a sensor coverage area of said at least one sensor, said adjusting comprises controlling the sensor coverage adjusting unit of each sensor of said at least one sensor in order to adjust the sensor coverage area of said sensor based on information on a position of the installed sensor relative to at least one other installed sensor of the installed building service sensors. For example, the method comprises sending a control signal to the sensor coverage adjusting unit to adjust a sensor coverage area of the sensor.

For example, the sensor coverage adjusting unit may comprise a field-of-view adjusting unit.

For example, the sensor coverage adjusting unit may be a sensor signal processing unit for constraining, e.g. filtering or masking, a sensor signal in accordance with a desired sensor coverage area. For example, in case of an image sensor, the image may be masked.

For example, the sensor coverage adjusting unit may comprise at least one masking member.

For example, each sensor of said sensors comprises at least one masking member for masking sensor input of said sensor, and in the step of adjusting a sensor coverage area, said adjusting comprises controlling the at least one masking member of each sensor of said at least one sensor in order to adjust the sensor coverage area of said sensor.

For example, the masking member masks the field-of-view of the sensor. For example, the mask member may be a switchable masking member that is, for example, effective in a switched-on state.

A sensor coverage adjusting unit or, in particular, one or more masking members, may facilitate an internal and/or automatic adjusting of the sensor coverage area without requiring adapting the surroundings, such as furniture or other equipment.

In one embodiment, each sensor of said at least one installed building service sensor comprises wireless communication means, and the method further comprises the step of: each sensor of said at least one sensor establishing a wireless communication between said sensor and at least one other building service device of the building service system via the wireless communication means of the sensor to determine said position of the sensor relative to said at least one other building service device. For example, said at least one other building service device is at least one other installed sensor of said installed building service sensors. Thus, commissioning or adjusting a building service system according to changing workspace layouts may be facilitated. For example, said information on a position of the sensor relative to said at least one other device may be determined using received signal strength indication values indicative of a distance of separation between two communicating devices. Additionally or alternatively, said information on a position of the sensor relative to said at least one other device may be determined using time of flight values indicative of a distance of separation between two communicating devices. Determining positional information from establishing a wireless communication may be complimented or replaced by providing predetermined positional information.

For example, the building service sensors comprise any one or more of presence detection sensors, movement sensors, temperature sensors, humidity sensors, air quality sensors, and daylight sensors. For example, presence detection sensors, or occupancy sensors, may monitor a workspace in order to control building service supply devices, such as luminaires, in accordance with the presence of a person at a workspace.

For example, the installed building service sensors may comprise optical sensors, e.g. light sensors, photosensors, and/or cameras. For example, an optical sensor may be a presence detection sensor and/or a daylight sensor. For example, the installed building service sensors may comprise optical sensors for visible and/or infrared (IR) light. For example, the installed building service sensors may comprise a combination of different sensors.

In a further aspect of the invention, there is provided a building service system, comprising a group of first building service sensors, at least one sensor of the group of first sensors comprising a sensor coverage adjusting unit for adjusting a sensor coverage area of the sensor, wherein each sensor coverage adjusting unit is adapted for adjusting, in a state of the system with the first sensors being installed, the sensor coverage area of the respective installed sensor based on information on a position of the installed sensor relative to at least one other installed sensor of the group of first sensors.

For example, the system further comprises at least two building service supply devices, wherein each sensor of the group of first sensors is adapted to control at least one of the building service supply devices that is assigned to the sensor. For example, the building service system further comprises at least one second sensor, wherein each sensor of the group of first sensors is adapted to control said at least one building service supply device that is assigned to said sensor to operate in a first operation mode, and wherein the at least one second building service sensor is adapted to control at least one of the building service supply devices, which is assigned to at least one sensor of the group of first sensors, to operate in a second operation mode. For example, in a state of the system with the first sensors and the at least one second sensor being installed, a sensor coverage area of the second sensor includes sensor coverage areas of at least two sensors of the group of first sensors.

For example, the system further comprises at least one building service supply device, the system further comprising at least one control unit adapted for using, in a state of the system with the first sensors and the supply device being installed, information on the positions of the installed first sensors to assign to at least one sensor of said installed first sensors at least one of the at least one installed building service supply device.

For example, the system further comprises at least one control unit for controlling, in a state of the system with said sensors of the group of first sensors being installed, the sensor coverage adjusting unit of the respective at least one installed sensor of the group of first sensors to adjust the sensor coverage area of each of said at least one sensor of the group of installed first sensors based on information on a position of the installed sensor relative to at least one other installed sensor of the group of first sensors. For example, each of said at least one building service sensor of the group of first sensors may comprise a control unit for controlling, in a state of the system in which the sensors are installed, the sensor coverage adjusting unit of the sensor to adjust the sensor coverage area of the sensor based on said positional information.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
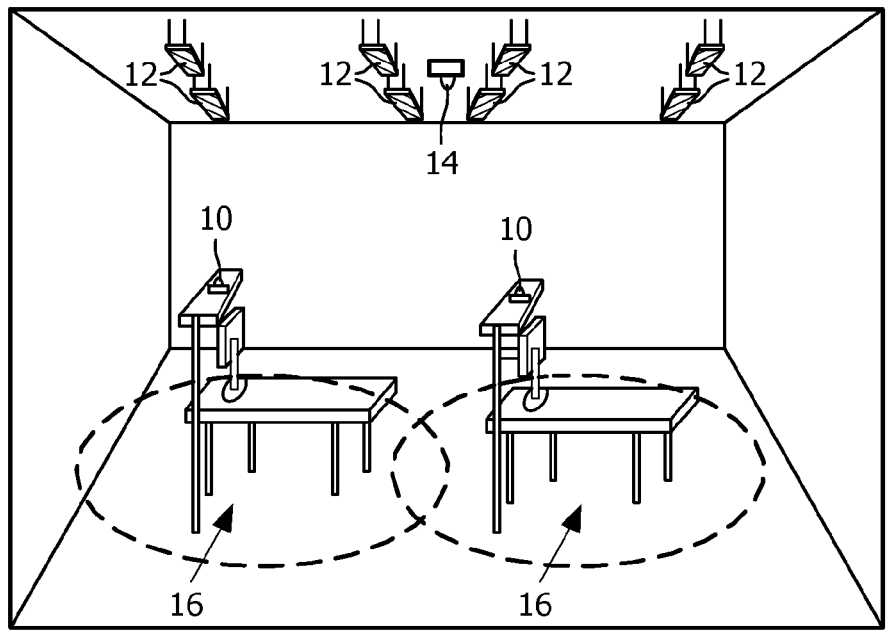
FIG. 1 schematically illustrates a building service system having presence detection sensors and luminaires installed in an indoor space.

FIG. 1 shows a group of two first building service sensors 10 of a building service system, as well as a group of building service supply devices 12 in the form of luminaires. The building service sensors 10 are, for example, presence detection sensors. For example, the building service system comprises a group of second building service sensors 14, of which one presence detection sensor is shown in FIG. 1. The sensors 10, 14 and the building service supply devices 12 are installed in a multi-occupant space. In the example of FIG. 1, the multi-occupant space comprises, for example, two workspaces 16, which are illustrated by desks. Each workspace is equipped with a sensor 10 for detecting the presence of a person at the respective workspace 16. The sensor 14 is, for example, centrally mounted on the ceiling. The sensor 14 is arranged to monitor the entire space including both workspaces 16.

Figure 2:
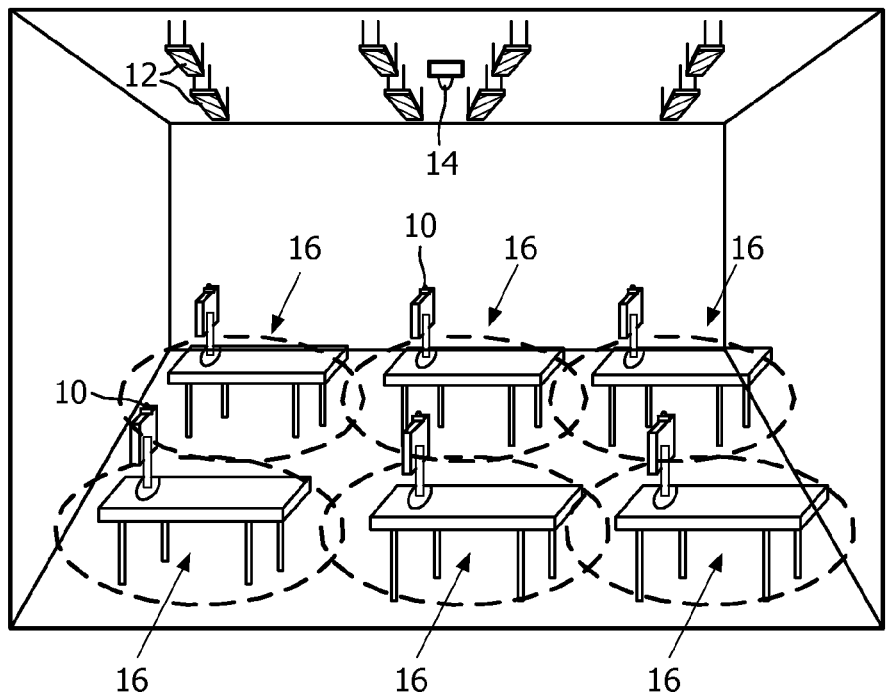
FIG. 2 schematically illustrates a similar building service system with a different setup.

FIG. 2 shows a different configuration of the building service system that differs from the example of FIG. 1 in that there is a different number of building service sensors 10. For example, six building service sensors 10 are installed in the space in accordance with an arrangement of six workspaces 16.

Figure 3:
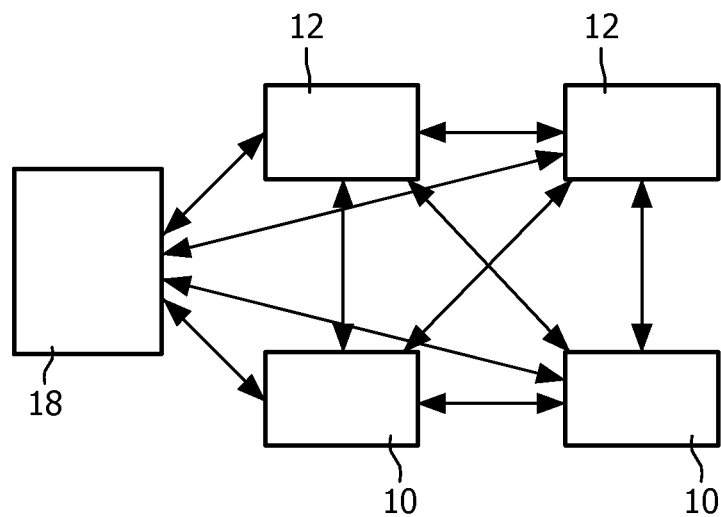
FIG. 3 schematically illustrates a configuration of the building service system.

FIG. 3 schematically shows a building service system that corresponds to the system of FIGS. 1 and 2. In FIG. 3, there are exemplarily shown two building service sensors 10 of the group of first building service sensors, two building service supply devices 12, and a building service system control unit 18 of the building service system. Possible communication between the control unit 18, the sensors 10 and the building service supply devices 12 during commissioning or adjusting of the building service system is exemplarily indicated by arrows between respective communicating members of the building service system.

Figure 4:
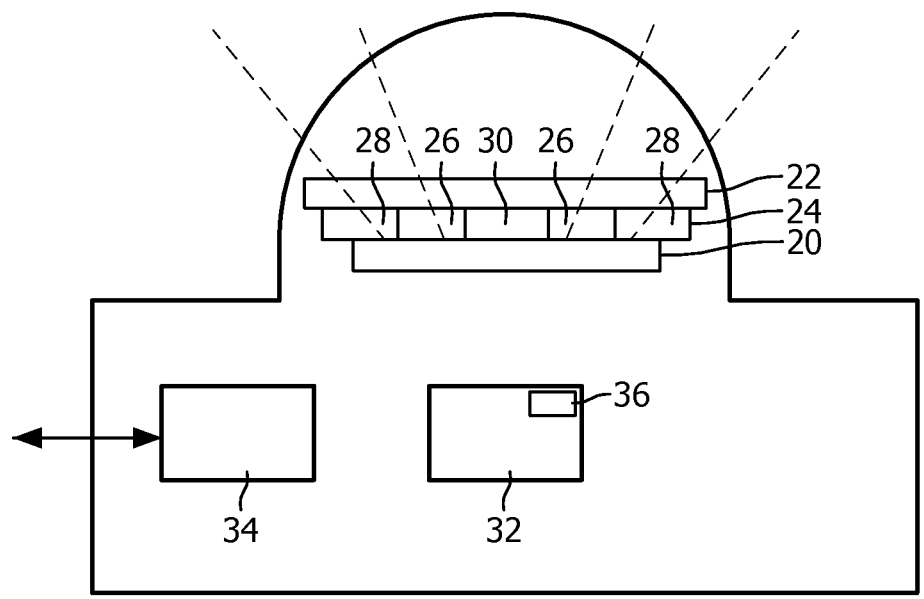
FIG. 4 schematically illustrates a building service sensor.

FIG. 4 schematically shows one of the building service sensors 10. For example, the sensor 10 is a presence detection sensor or a motion sensor. Specifically, the sensor 10 is an infrared sensor, in particular a passive infrared sensor. The sensor 10 comprises a sensing unit 20 that is sensitive to infrared radiation. In front of the sensing unit 20, there is arranged a sensor optics 22, which comprises e.g. one or more lenses and is schematically shown in FIG. 4. For example, the sensor optics 22 may be a Fresnel lens. The sensor optics 22 directs radiation or light from a multitude of angles onto the sensing unit 20. Whereas in FIG. 4, an aperture angle of less than 90° is illustrated, in practice, the field-of-view may comprise an aperture angle of 180° or more.

The sensor optics 22 and the sensing unit 20 define a maximum sensor coverage area, which is the area around the sensor 10 that is "visible" to the sensing unit 20 through the sensor optics 22.

The sensor 10 further comprises a sensor coverage adjusting unit 24, which is arranged in front of the sensing unit 20. For example, the sensor coverage adjusting unit 24 is arranged between the sensing unit 20 and the sensor optics 22. For example, the sensor covering adjusting unit 24 comprises LCD-elements for masking corresponding parts of the sensing unit 20. In FIG. 4, for illustration purposes, inner LCD-elements 26 and outer LCD-elements 28 are shown, which are, for example, arranged in concentric rings. The LCD-elements 26, 28 are switchable. In a transparent state, the respective LCD-element allows light to pass there through. In an opaque state, the LCD-element masks light from a corresponding range of angles. For example, when all LCD-elements 26, 28 of the adjusting unit 24 are transparent, the field-of-view of the sensing unit 20 corresponds to the maximum sensor coverage area, corresponding to a first aperture angle in a plane that comprises the central axis of the sensor optics 22. For example, when the central axis is vertical, said plane is a vertical plane. However, when the outer LCD-elements 28 are in a non-transparent state and the inner LCD-elements 26 are transparent, the field-of-view of the sensing unit 20 will be confined corresponding to a second aperture angle that is smaller than the first aperture angle in said plane. Thus, the sensor coverage area is limited correspondingly. When the inner and outer LCD-elements 26, 28 are in a non-transparent state, light may only pass through a core element 30 of the sensor coverage adjusting unit 24, and, correspondingly, the field-of-view is further narrowed. Thus, by selectively switching the LCD-elements 26, 28, which form masking members for masking sensor input of the sensing unit 20, the field-of-view of the sensing unit 20, and, thus, the sensor coverage area of the sensor 10 may be adjusted.

For example, the sensor 10 comprises a sensor control unit 32 for controlling the sensor coverage adjusting unit 24. For example, the control unit 32 may comprise a processing unit and a memory. For example, the control unit 32 may be a microcontroller. Further, the sensor 10 comprises wireless communication means 34 in the form of a wireless communication interface. For example, the wireless communication interface is adapted to operate according to the ZigBee standard. For example, the control unit 32 controls the wireless communication means 34.

In the following, a preferred embodiment of a method of adjusting the first sensors 10 of the building service system will be described. For example, the method may be a method of commissioning the building service system.

In a first step, each sensor 10 of the group of first installed sensors establishes, via the wireless communication means 34, a wireless communication between the sensor 10 and at least one other sensor 10 of the group of first sensors. Thereby, information on a position of the sensor relative to the at least one other sensor is determined. Various automatic position determining solutions are possible, e.g. RF-based, ultrasound-based, active infrared-based, and coded light-based position determining.

For example, a distance to another sensor may be determined using received signals strength indication values indicative of a distance of separation between the two communicating sensors, and/or using time of flight values indicative of a distance of separation between the two sensors. For example, in the setup of FIG. 1, the positional information may consist of the distance between the two sensors 10.

When there are more than two sensors 10, such as in the configuration of FIG. 2, further relative positional information may be determined by triangulation e.g. using relative distances between at least three different sensors 10. For example, positional information may be determined under the assumption that all sensors 10 are approximately arranged in a horizontal plane, i.e. using planar triangulation. When using distance information of more than three sensors, for example, vertical positional information may be determined, as well.

For example, each sensor 10 may generate a map 36 of the spatial arrangement of at least some sensors 10 using the determined positional information. For example, the map, being a set of positional information relative to different other sensors 10, may be stored in a memory of the control unit 32. Preferably, each sensor 10 determines a map 36 comprising positional information about each of the installed sensors 10. However, in practice, it may be sufficient if the map 36 comprises positional information about neighboring sensors only, or even positional information about the nearest neighboring sensor 10, only. For example, the positional information may be information on a distance between respective sensors 10.

As has been described above, positional information relative to an other sensor 10 may be determined by directly measuring a distance between sensors and, optionally, by triangulation. However, a sensor 10 may also relay positional information from sensors to other sensors.

As described, each sensor 10 is adapted to generate a construct a location map 36 or floor plan to localize itself, i.e. determine information on the position of the sensor 10 relative to one or more other installed sensors 10.

In this example, the map is obtained by each sensor in a distributed way, i.e. the sensors 10 determine the positional information based on wireless communication between the sensors 10, only.

Additionally, for example, a wireless communication may be established between the sensors 10 and the control unit 18 to determine positional information.

However, a map of the special arrangement of the sensors 10 may also be determined in a centralized way. For example, the map may be determined by the control unit 18 based on positional information of a sensor that is communicated to the control unit 18. For example, all sensors 10 may communicate gathered positional information to the control unit 18, which combines it.

Furthermore, for example, the sensor 14 of the group of second sensors and/or the supplying devices 12 may also comprise wireless communication means. For example, the sensors 10, the sensor 14 and/or the being service supply devices 12 may form nodes of a wireless communication network, and each node may establish a wireless communication between said node and at least one other node via the wireless communication means of the node to determine information on a position of the node relative to said at least one other node. Thus, positional information from the sensor 14 and the supply devices 12 may be used to determine information on a position of a sensor 10 relative to at least one other sensor 10 of the group of first sensors.

In the examples described above, the sensors 10 use their wireless communication means 34 for determining positional information. The wireless communication means 34 may, for example, be an infrared communication means, a coded light communication means, or a radio frequency (RF) communication means.

Positional information of a sensor 10 may also be determined from establishing wireless communication between the sensors 10 and, for example, other building service devices of the building service system, like the sensor 14, the building service supply devices 12 or the control unit 18.

Positional information of a sensor 10 may also be determined in manner similar to triangulation known from WO2006/095317 A1, and/or similar to deriving maps of wirelessly interconnected network nodes as disclosed in WO2006/095315 A1.

In a further example, the sensing unit 20 may form a receiving means of the wireless communication means 34 of the sensor 10. Thus, the sensors 10 may use the modality that the sensors also use for sensing, for establishing the wireless communication between sensors to determine the positional information. In the example described, the modality is infrared radiation. However, as will be explained further below, the sensor 10 may also be an ultrasound sensor, for example.

In a further example, each sensor 10 of the group of first sensors establishes a wireless communication between said sensor 10 and at least one of the building service supply devices 12, e.g. via the wireless communication means 34 of the sensor 10, to determine information on a position of the sensor relative to said at least one building service supply device 12. The positional information and, optionally, further information on positions of the supply devices 12 may be used to determine information on a position of each sensor 10 relative to at least one other sensor 10. For example, in the case of coded light-based positioning, all devices 12 emit via coded light a unique identifier, and each presence detection sensor 10 comprises a coded light detector, e.g. in the form of the sensing unit 20, to detect the unique identifier. By observing the identifiers of the detected devices 12 and the relative strength, each sensor 10 can determine its position in relation to the other sensors.

For example, information on the positions of the building service supply devices 12 may be communicated by the building service supply devices 12 and/or the control unit 18 to the sensors 10. This may allow, for example, to determine the relative positions of the sensors 10 of the group of first sensors relative to each other based on a known map of the positions of the building service supply devices 12 and on establishing the wireless communication between the sensors 10 and supply devices 12. Thus, when the layout of workspaces 16 changes, new positions of the sensors 10 may be easily determined.

In a similar manner, a known position of a sensor 14 of the group of second sensors may be used in determining information on a position of a sensor 10 relative to at least one other sensor 10.

In a further example, the control unit 18 may communicate to each sensor 10 information on a position of the sensor 10 relative to at least one other sensor 10. For example, a predetermined map of the special positions of the sensors 10 may be used. Relative positioning among the sensors 10 can be calculated using an (electronic) layout map of the room indicating the position of luminaires 12. In this case, the Euclidean distance can be calculated. Note that such layout maps are usually available to the facility manager or commissioning engineer. In this case or in other cases described above, relative positional information may be determined from information on absolute positions, i.e. positions relative to a reference point. For example, the position of the control unit 18 may be the reference point of absolute positional information.

In the preferred embodiment of the method, in a second step, the sensor coverage area of each sensor 10 of the group of installed first sensors is adjusted based on the information on a position of the sensor 10 relative to at least one other sensor of the group of first sensors. For example, the sensor coverage area may be adjusted according to one or more pre-determined rules. For example, the sensor coverage area of the sensor 10 may be adjusted to overlap at maximum a pre-determined proportion of the sensor coverage area of another sensor 10. For example, the pre-determined proportion may be 15%.

In FIG. 1 and FIG. 2, adjusted sensor coverage areas of the respective sensors 10 are indicated schematically by dashed circles. For example, the sensor coverage areas overlap at their peripheries.

For example, a desired size of the sensor coverage area of a sensor 10 may be determined to be half of the distance of the sensor 10 to its nearest neighboring sensor 10, optionally plus an extra amount for allowing overlap.

For example, when adjusting a sensor coverage area of a sensor 10, said positional information may comprise information on the direction relative to the sensor 10, in which direction the respective other sensor 10 is positioned.

As explained above, the individual sensor coverage areas of the sensors 10 may be automatically adjusted based on the information on the position of the respective installed sensor 10 relative to at least one other sensor 10. Thus, depending on the room layout and depending on the location of the workspaces, the sensors may cover different areas. In the configuration of FIG. 2 of a room with two desks or workspaces, the two sensors 10 have a coverage area corresponding approximately to about half the size of the room, each covering comparatively large areas around each workspace 16. When the same room is divided into a greater number of workspaces, such as in the configuration of FIG. 2 with six desks or works spaces, each sensor 10 will cover a smaller space.

For example, the control unit 32 of each sensor 10 controls the sensor coverage adjusting unit to adjust the sensor coverage unit based on said positional information. For example, the control unit 32 determines a desired sensor coverage area and controls the sensor coverage adjusting unit 24 accordingly.

Alternatively or additionally, for example, the control unit 18 controls the sensor coverage adjusting units of the sensors 10 based on said positional information. For example, the control unit 18 may determine for each of the sensors 10, or for some of the sensors 10, a desired sensor coverage area. The desired coverage area may, for example, be communicated by the wireless communication means 34 to the respective sensor 10, and the sensor coverage adjusting unit 24 may be controlled accordingly. For example, the control unit 18 may issue sensor coverage adjustment commands to each sensor 10.

In a third step of the method, information on the positions of the installed sensors 10 is used to assign to each sensor 10 of the group of first sensors at least one of the installed building service supply devices 12. For example, to each sensor 10, at least the nearest neighboring building service supply device 12 is assigned. For example, each sensor 10 is assigned to those ceiling luminaires 12 installed in the sensor's 10 close surroundings. Techniques for assigning, i.e. binding, a sensor 10 to a building service supply device 12 are known in the art. For example, coded light may be used.

For example, in the configuration of FIG. 1, a left sensor 10 may be assigned to the four left luminaires, and a right sensor 10 may be assigned to the four right luminaires of the building service supply device 12. Said assigning is preferably performed automatically.

For example, each sensor 10 is enabled to control the building service supply devices 12, to which the sensor is assigned. Said controlling may be in accordance with suitable control strategies. For example, when a presence detection sensor 10 detects the presence of a person within its sensor coverage area, the corresponding ceiling lighting luminaires 12 are switched on. For example, they are switched to a first output level of e.g. 100% light output. Thus, illumination of the respective workspace 16 is provided.

Furthermore, for example, when the presence detection sensor 14, a sensor coverage area of which may correspond to approximately the whole installed area of luminaires 12, detects the presence of a person, all luminaires 12 may be switched to at least a second output level that is less than the first level, for example, 50% light output. Control by sensors 10 preferably overrides control by the general sensor 14. Thus, an energy saving illumination of the indoor space with reduced light output, triggered by the general sensor 14 of the group of second sensors, may be combined with full illumination of occupied workspaces. Thus, the type of dual control balances light personalization to occupants of individual workspaces 16 with being energy efficient.

Furthermore, for example, binding of the sensors 10 to the respective building service supply devices 12 may be based on the adjusted sensor coverage areas of the sensors 10. In the configuration of FIG. 2, for example, each sensor 10 may be assigned to the respective two nearest neighboring luminaires 12. Thus, one building service supply device 12 may be assigned to more than one sensor 10, for example, when it is near the peripheries of two sensor coverage areas.

The task of assigning the sensor 10 to the building service supply devices 12 can be performed by any one of: (i) programming selected sensors 10 to control (i.e. send signals to) specified supply devices 12; (ii) programming selected supply devices 12 to be responsive to signals from specified sensors 10; or (iii) a combination of (i) and (ii) above.

Said assigning may be performed on a distributed or a global basis. In other words, a central control unit, e.g. the control unit 18, may be used to receive all topology information and assign to specific sensors 10 appropriate building service supply devices 12. Alternatively, each sensor 10 may determine and assign its own building service supply devices 12, e.g. performed by the control unit 32.

The described example of the method of adjusting the first sensors 10 of the building service system allows to automatically determine positions of presence detection sensors 10, adjust sensor coverage areas of the sensors 10, and establish, in accordance with the positions of the sensors 10, a binding of the sensors 10 to respective luminaires 12.

Adjusting the sensor coverage areas allows to provide a more precise control of building service supply devices 12 that are to be assigned to a personal workspace 16.

While the invention has been illustrated and described in detail in the drawings and foregoing description, such illustration and description are to be considered illustrative or exemplary and not restrictive; the invention is not limited to the disclosed embodiments.

The invention has been particularly described in connection with commissioning of presence detection sensors sensitive for infrared radiation. It will be noted that a similar principle of adjusting a sensor coverage area can also be applied to other forms of sensors 10.

For example, the sensor 10 may be an acoustic sensor, e.g. an ultrasound sensor. For example, the sensor may comprise an acoustical lens and a sensor coverage adjusting unit in form of one or more acoustical masking members.

Furthermore, for example, the method allows to re-adjust the sensor coverage areas, for example, after a change of the room layout.

Furthermore, for example, the steps of determining the positions, adjusting the coverage areas and/or assigning may be repeated. This may allow a real-time adjusting of the sensor coverage areas, for example.

Furthermore, for example, the method may be a method of operating a building service system, the method comprising said step of determining the positions, said step of adjusting the coverage areas and/or said step of assigning.

Furthermore, for example, the sensor coverage adjusting unit may be adapted to adjust a threshold of a sensor input detection in order to adjust the sensor coverage area.

Furthermore, for example, the sensor 10 may be an optical sensor in the form of a camera; for example, the sensor coverage adjusting unit may comprise one or more image sensor masking members; furthermore, for example, the sensor coverage adjusting unit may be adapted to adjust the field-of-view by accordingly adjusting the optical configuration of the camera. For example, the camera may comprise a zoom lens for adjusting the sensor coverage area. Furthermore, the sensor coverage adjusting unit may be formed by a software module of a control unit of the camera. For example, the sensor coverage adjusting unit may comprise an electronic zoom.

For example, the coverage area may be adjusted based also on information on a vertical position of the sensor 10 relative to a floor level. For example, the sensor 10 may be mounted on a ceiling, and, for example, the sensor may comprise a field-of-view that is directed downwards. For example, such vertical positional information may comprise any one or more of an average sensor mounting height, a vertical position of the sensor that is communicated to the sensor by e.g. the control unit 18, or a measured vertical position. For example, an ultrasound sensor may be adapted to measure vertical positional information of the sensor, such as the mounting height of the sensor above a floor.

Furthermore, for example, the sensor may be an active sensor, i.e. a sensor that is adapted to output a sensing signal and sense, using e.g. the sensing unit 20, a response or reflection signal. For example, the sensor coverage adjusting unit may be adapted to adjust the magnitude and/or amplitude and/or angle of radiation of the output sensing signal. For example, by limiting the sensing signal amplitude, the detection range may be limited and, thus, the sensor coverage area may be adjusted.

Furthermore, the invention has been particularly described in connection with the commissioning of wirelessly controlled luminaires in a building. It will be noted that a similar principle can also be applied to other forms of building service supply devices installed within a building that might need to be controlled wirelessly by remotely located sensors, such as window blinds or curtains and the like. The expression "building service supply device" as used herein is therefore intended to encompass all such remotely controllable electrical devices installed in a building.

For example, a similar method as described may be performed for adjusting sensors of a building service system comprising building service supply devices in the form of heating units, ventilation units, and/or air conditioning units. Such units may be controlled, for example, additionally to luminaires. Thus, personalized light and HVAC (heating, ventilating, air conditioning) spaces may be realized.

Furthermore, for example, the sensors 10 may be daylight sensors. By adjusting the sensor coverage areas of daylight sensors and, for example, assigning respective luminaires 12 to the individual sensors 10, illumination by luminaires may be controlled in accordance with local daylight availability. Commissioning of the building service system may be facilitated due to automatic adjusting of the sensor coverage areas.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. Method of adjusting at least one sensor of installed building service sensors of a building service system, the method comprising the step of:
    automatically adjusting a sensor coverage area of said at least one sensor, the adjusting of the sensor coverage area of each sensor of said at least one sensor being based on information on a position of the sensor relative to at least one other sensor of the installed building service sensors,
    wherein each of said at least one sensor comprises at least one switchable element comprising a plurality of liquid crystal display elements, said plurality of liquid crystal display elements disposed between an input sensing element of said sensor and the sensor coverage area of the sensor, for masking sensor input of said sensor, and the step of automatically adjusting a sensor coverage area comprises controlling the at least one switchable element of each of said at least one sensor in order to adjust the sensor coverage area of the sensor, and
    wherein in each sensor of said at least one sensor, the plurality of liquid crystal display elements are arranged in at least a two-dimensional pattern.

2. Method as claimed in claim 1, wherein the system further comprises at least one of installed building service supply devices, the method further comprising the step of:
    using information on the position of said at least one sensor to assign to each of said at least one sensor, at least one of the installed building service supply devices.

3. Method as claimed in claim 2, wherein the at least one of installed building service supply devices is selected from the group consisting of one or more of luminaires, heating units, ventilation units and air conditioning units.

4. Method as claimed in claim 1, wherein in the step of automatically adjusting a sensor coverage area of said at least one sensor, the sensor coverage area of each sensor of said at least one sensor is adjusted based on information on a position of the sensor relative to at least a nearest neighboring sensor of the installed building service sensors.

5. Method as claimed in claim 1, wherein, in the step of automatically adjusting a sensor coverage area of said at least one sensor, the sensor coverage area of each of said at least one sensor is adjusted based on a map of a spatial arrangement of at least said at least one installed sensor of the installed building service sensors.

6. Method as claimed in claim 1, wherein in the step of automatically adjusting a sensor coverage area of said at least one sensor, each sensor of said at least one sensor performs the step of:
    adjusting a sensor coverage area of the sensor based on information on a position of the sensor relative to at least one other sensor of the installed building service sensors.

7. Method as claimed in claim 1, wherein each of said at least one sensor comprises a wireless communication unit, the method further comprising the step of:
    each of said at least one sensor establishing a wireless communication between said sensor and at least one other building service device of the building service system via the wireless communication unit of the sensor to determine said position of the sensor relative to said at least one other building service device.

8. Method as claimed in claim 1, wherein said installed building service sensors comprise any one or more of presence detection sensors, movement sensors, temperature sensors, and daylight sensors.

9. Method as claimed in claim 1, wherein said installed building service sensors comprise optical sensors.

10. Method as claimed in claim 1, wherein the controlling comprises controlling the plurality of liquid crystal display elements to alter an input angle of the sensor coverage area.

11. Method as claimed in claim 1, wherein, in each sensor of said at least one sensor, the plurality of liquid crystal display elements are arranged in at least one ring.

12. Method as claimed in claim 11, wherein said at least one ring is a plurality of concentric rings, and wherein each ring of said concentric rings is composed of a different, respective set of the liquid crystal display elements.

13. Method as claimed in claim 12, wherein each ring denotes a different, respective input angle of the sensor coverage area and wherein the adjusting of the sensor coverage area comprises setting the sensor coverage area to a given input angle corresponding to a given set of said sets of the liquid crystal display elements by activating the ring composed of the given set.

* * * * *